United States Patent [19]
Han et al.

[11] Patent Number: 6,043,428
[45] Date of Patent: Mar. 28, 2000

[54] PHOTOELECTRIC MATERIAL USING ORGANIC PHOTOSENSITISING DYES AND MANUFACTURING METHOD THEREOF

[75] Inventors: Liyuan Han; Takatsugu Obata; Yuko Inoue, all of Nara, Japan

[73] Assignee: Sharp Kabushiki Kaisha, Osaka, Japan

[21] Appl. No.: 09/102,897

[22] Filed: Jun. 23, 1998

[30] Foreign Application Priority Data

Jun. 23, 1997 [JP] Japan .................................. 9-165745

[51] Int. Cl.[7] .................................................. H01L 31/00
[52] U.S. Cl. ............................................................ 136/263
[58] Field of Search ............................................ 136/263

[56] References Cited

U.S. PATENT DOCUMENTS

| | | | |
|---|---|---|---|
| 4,105,470 | 8/1978 | Skotheim | 136/263 |
| 4,367,369 | 1/1983 | Mizutani et al. | 136/263 |
| 4,927,721 | 5/1990 | Gratzel et al. | 429/111 |
| 5,084,365 | 1/1992 | Gratzel et al. | 429/111 |

FOREIGN PATENT DOCUMENTS

| | | |
|---|---|---|
| 0 039 085 | 11/1981 | European Pat. Off. . |
| 0 134 518 | 3/1985 | European Pat. Off. . |
| 0 692 800 | 1/1996 | European Pat. Off. . |
| 1-220380 | 9/1989 | Japan . |
| 5-504023 | 6/1993 | Japan . |
| 7-249790 | 9/1995 | Japan . |
| WO 88/06175 | 8/1988 | WIPO . |
| WO 91/16719 | 10/1991 | WIPO . |
| WO 94/05025 | 3/1994 | WIPO . |

OTHER PUBLICATIONS

Sakamoto et al. "Synthesis of Soluble Metal Phthalocyanine Derivatives and their Electron Transfer Properties", *JSDC*, vol. 112, Dec. 1996, pp. 368–374.

Law et al., "Preparation, Solution Behaviour and Electrical Properties of Ostasubstituted Phthalocyaninato and 2,3–naphthalocyaninato Oxotitanium (IV) Complexes", *J. Mater. Chem.*, 1997, 7(10), pp. 2063–2067.

*Primary Examiner*—Mark Chapman
*Attorney, Agent, or Firm*—Nixon & Vanderhye, P.C.

[57] ABSTRACT

A photoelectric material having high efficiency and superior durability is provided. The photoelectric material includes a semiconductor and a photosensitizing dye attached to the semiconductor, wherein the dye is a phthalocyanine derivative, a dioxazine derivative or an indigo derivative having at least one interlocking group and at least one hydrophobic group selected from the group consisting of monovalent substituted and unsubstituted aliphatic hydrocarbon groups and monovalent substituted and unsubstituted alicyclic hydrocarbon groups. The hydrophobic group is preferably an alkyl group with 3 to 12 carbon atoms. The interlocking group is a carboxyl group, a sulfonic acid group, phosphono group or the like. In manufacturing the photoelectric material, the dye is dissolved in a hydrophobic and/or aprotic solvent. In order to attach the dye to the semiconductor, the semiconductor is dipped in the dye solution.

22 Claims, 1 Drawing Sheet

PHOTOELECTRIC MATERIAL USING ORGANIC PHOTOSENSITISING DYES AND MANUFACTURING METHOD THEREOF

BACKGROUND OF THE INVENTION

1. Field of the Invention

The present invention relates to a photoelectric material and a manufacturing method thereof, a photoelectric device, and a photosensitiser used therefor. More specifically, the present invention relates to a photoelectric material used for a photoelectric device such as a photovoltaic cell, and a manufacturing method thereof.

2. Description of the Background Art

The photoelectric material refers to a material which converts optical energy to electric energy. When the photoelectric material is irradiated with light, electrons bound in the material are released to move freely by the optical energy, whereby free electrons and holes are generated. When the generated free electrons and holes are separated with high efficiency, electric energy can be continuously obtained from optical energy in the photoelectric material. Such photoelectric material is utilized in a solar cell, for example.

Recently, a wet type solar cell using a photosensitising dye and having high conversion efficiency has been attracting widespread attention. Such a wet type solar cell is mainly formed of a semiconductor electrode, a counter electrode and an electrolyte layer held between these electrodes, for example. In the semiconductor electrode, which is the photoelectric material, a photosensitising dye having an absorption spectrum in a visble light range is attached to the surface of the semiconductor. In the cell, when the semiconductor electrode is irradiated with light, electrons are generated on the side of the electrode, and the electrons move through an electric circuit to the counter electrode. The electrons which have moved to the counter electrode are transferred by ions in the electrolyte, and return to the semiconductor electrode. By the repetition of this process, electric energy is taken out.

Japanese Patent Laying-Open No. 1-220380 discloses a solar cell having a photosensitising dye such as a transition metal complex attached to the surface of a metal oxide semiconductor. According to the method of manufacturing the solar cell, the metal oxide semiconductor is dipped in an aqueous solution containing the photosensitising dye at room temperature, whereby the photosensitising dye is attached to the surface of the semiconductor.

International Publication No. WO91/16719 and the corresponding Japanese National Publication No. 5-504023 disclose a photovoltaic cell having a titanium dioxide layer doped with metal ions or boron to which a photosensitiser is applied. In the photovoltaic cell, the photosensitiser includes transition metal complexes wit the ligands being bidentate, tridentate or omnidentate polypyridyl compounds, which may be unsubstituted or substituted, and transition metal complexes with at least one ligand comprising a mononuclear cyano-containing pyridyl compound. In the method of manufacturing such photovoltaic cells, a titanium dioxide semiconductor layer is placed in an ethanol solution containing the photosensitiser, whereby the photosensitiser is attached to the semiconductor layer.

International Publication No. WO94/05025 discloses a photovoltaic cell having a photosensitiser selected from optical brightener compounds and phthalocyanine compounds attached to a titanium dioxide layer. In the method of manufacturing such a photovoltaic cell, the photosensitiser is dissolved in ethanol, and the resulting ethanol solution is used for attaching the photosensitiser to the titanium dioxide layer.

Japanese Patent Laying-Open No. 7-249790 discloses that in a method of manufacturing a photoelectric material used for a solar cell, a photosensitizing dye is adsorbed to the surface of a semiconductor by heating and refluxing a liquid containing the photosensitising dye and the semiconductor. In this publication, it is disclosed that metal phthalocyanine such as copper phthalocyanine and titanyl phthalocyanine, chlorophyll, hemin, complexes of ruthenium, osmium, iron or zinc as disclosed in Japanese Patent Laying-Open No. 1-220380 and in Japanese National Publication No. 5-504023, metal-free phthalocyanine, cyanine dyes, merocyanine dyes, xanthene dyes, and triphenylmethane dyes can be used as the photosensitising dye. Further, this laid-open publication discloses that in manufacturing the photoelectric material, water, alcohols, toluene or dimethyl formamide may be used as a liquid in which the photosensitising dye is dissolved. On the other hand, the laid-open publication discloses only a specific example in which cis-$(SCN)_2$-bis (2,2'-bipyridyl-4,4'-dicarboxylate) ruthenium (II) is dissolved in ethanol, a glass plate having a titanium oxide film thereon is placed in the ethanol solution, the ethanol solution is heated and retluxed and the dye is adsorbed to the titanium oxade film. The laid-open publication does not provide any support for the possibility of practical use of the photosensitising dyes other than the ruthenium complex in the photoelectric material. Further, the laid-open publication does not provide any information as to whether solvents other than ethanol can be practically used to solve the photosensitising dye in manufacturing the photoelectric material

SUMMARY OF THE INVENTION

Though ethanol solutions of photosensitising dyes have been used in practical manufacturing of photoelectric materials in the prior art described above, the inventors of the present invention have found that such ethanol solutions are not necessarily appropriate to attach the photosensitising dye to the semiconductor. The inventors have found that a hydrophilic solvent such as ethanol may contain a relatively large amount of water, and that the water reacts with active sites on the semiconductor surface to prevent adsorption of the dye, hindering strong fixation of the desired amount of dye on the semiconductor surface. The smaller the amount of dye fixed to the semiconductor, the lower the photoelectric conversion efficiency of the resulting photoelectric material. Further, the inventors have found that the hydrophilic solvent such as ethanol which is apt to absorb water in the air is responsible for absorption of water into the semiconductor surface during the steps of manufacturing, and the life of the semiconductor is shortened.

In order to eliminate the influence of water as described above, a step of removing water from the hydrophilic solvent is necessary. The inventors, however, considered that even after the water removing step, the hydroxyl group of ethanol may react with active sites on the surface of the semiconductor and still hinder absorption of the desired amount of the dye and strong fixation of the dye.

The various phthalocyanine derivatives described in International Publication No. WO94/05025 are difficult to dissolve in general organic solvents. Therefore, it has been considered that, in the molecular state, they are difficult to be adsorbed to the semiconductor in the desired amount. It has been found that most of the conventional photosensitising dyes are difficult to dissolve in organic solvents. If a solution containing a dye in a sufficient concentration for absorption to the semiconductor is not available, a material having high photoelectric conversion efficiency cannot be obtained.

An object of the present invention is to provide a photoelectric material having relatively high photoelectric conversion efficiency.

Another object of the present invention is to provide a method of manufacturing a photoelectric material having relatively high photoelectric conversion efficiency readily at a low cost.

A still further object of the present invention is to provide a photoelectric device such as a solar cell, using a material having relatively high photoelectric conversion efficiency.

A still further object of the present invention is to provide a method of manufacturing a photoelectric material which can eliminate the influence of water and hydroxyl group described above.

A still further object of the present invention is to provide a practically useful photoelectric material using a dye of which usefulness has not been established in the prior art.

A still further object of the present invention is to provide a practically useful photosensitiser for a photoelectric material which is readily dissolved in an organic solvent, and to provide a photoelectric material using such a photosensitiser.

According to the present invention, provided is a method of manufacturing a photoelectric material including the steps of dissolving a dye functioning as a photosensitiser in one or more hydrophobic and/or aprotic solvents, and attaching the dye to a semiconductor by bringing the solvent containing the dye into contact with the semiconductor. If an aprotic solvent is used for dissolving the dye, the reaction of the solvent hydroxyl group with the surface active sites can be avoided. If a hydrophobic solvent is used for dissolving the dye, the above described influence of water can also be restricted as much as possible.

In the present invention, a photosensitiser having high solubility in a hydrophobic and/or aprotic solvent is preferably used. Such a photosensitiser consists essentially of an organic compound dye or an organometallic compound dye having at least one interlocking group and at least one hydrophobic group selected from the group consisting of monovalent substituted and unsubstituted aliphatic hydrocarbon groups and monovalent substituted and unsubstituted alicyclic hydrocarbon groups. Preferably, if the dye has a metal, such a hydrophobic group does not constitute a group which is directly bonded to the metal in the dye. Preferably, such a hydrophobic group is an alkyl group having 3 to 12 carbon atoms. Here, the interlocking group refers to a group having the function to provide electric coupling between the chromophoric group of the dyestuff and the conduction band of the semiconductor. The dye is generally attached to the surface of the semiconductor through the interlocking group. Descriptions related to the interlocking group in International Publication No. WO91/16719 and the corresponding Japanese National Publication No. 5-504023 are incorporated herein by reference. In the present invention, the interlocking group may be at least one selected from the group consisting of carboxyl group, hydroxyalkyl group, hydroxyl group, sulfonic acid group, carboxyalkyl group, mercapto group and phosphono group.

According to the present invention, provided is a photoelectric material including a semiconductor and a photosensitiser attached to the semiconductor wherein the photosensitiser consists essentially of an organic compound dye or an organometallic compound dye having at least one interlocking group and at least one hydrophobic group as described above. In the photoelectric material, preferably, the semiconductor is titanium oxide. The semiconductor may be in the form of particles or a film.

According to the present invention, a method of manufacturing a photoelectric material is provided which includes the steps of dissolving the above described organic compound dye or organometallic compound dye having at least one interlocking group and at least one hydrophobic group in a hydrophobic and/or aprotic solvent, and attaching the dye to a semiconductor by bringing the solvent containing the dye into contact with the semiconductor.

According to the present invention, a photoelectric device including the photoelectric material as described above and an electrode electrically connected to the photoelectric material is provided. For example, according to the present invention, a solar cell is provided which includes the above described photoelectric material, a conductive film, and an electrolyte held between the photoelectric material and the conductive film.

According to the present invention, a photoelectric device is provided which includes a first conductive layer, a semiconductor layer formed on the first conductive layer, a layer consisting essentially of the above described photosensitiser having at least one interlocking group and at least one hydrophobic group formed on the semiconductor layer, an electrolyte layer formed on the photosensitiser layer, and a second conductive layer being in contact with the electrolyte layer. The first and/or second conductive layer may be transparent. The semiconductor layer is, preferably, composed of titanium oxide.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
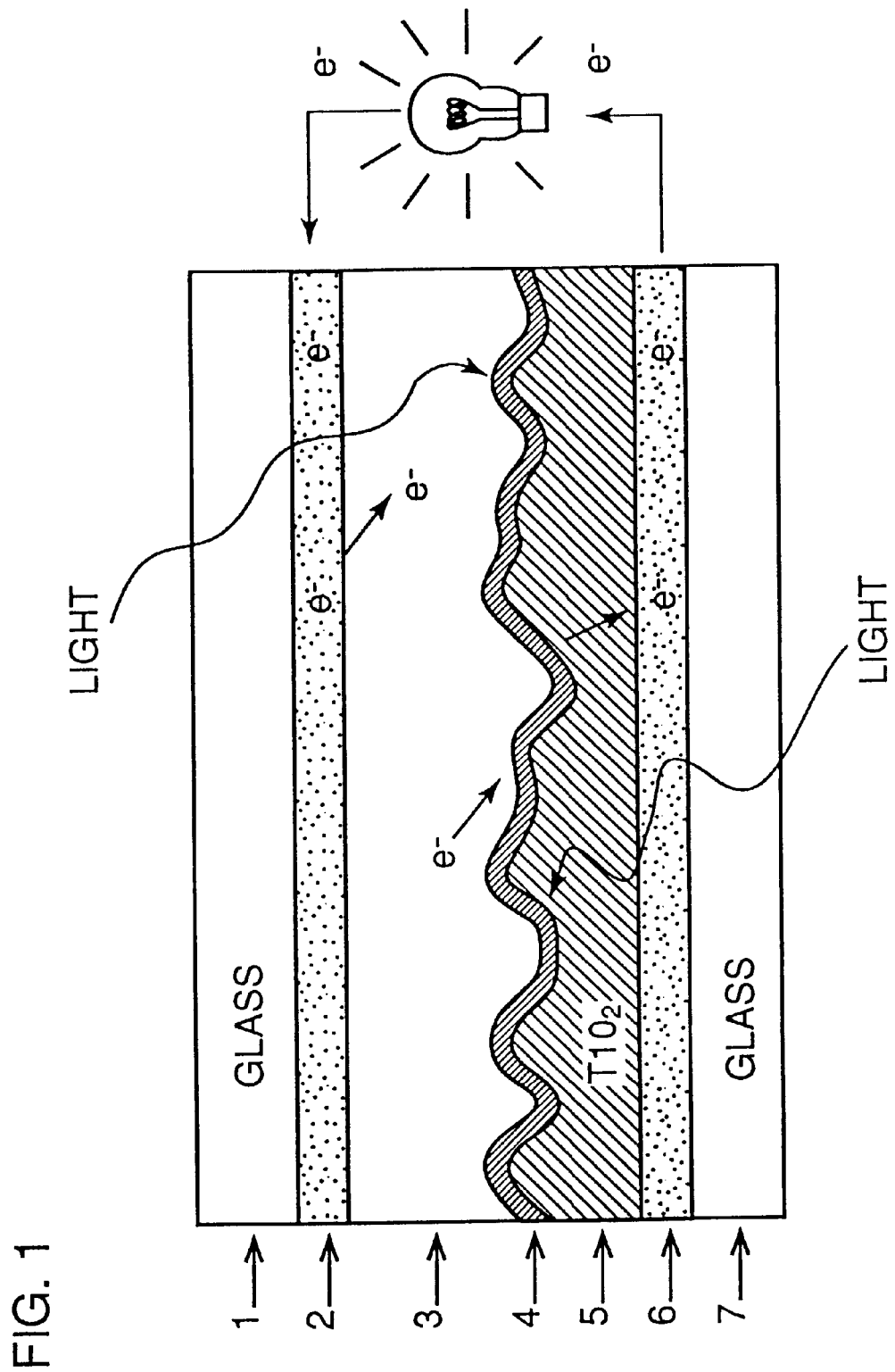
FIG. 1 is an illustration schematically showing the photoelectric material and the solar cell formed in accordance with the present invention.

In the present invention, the semiconductor to which the photosensitising dye is attached (adsorbed or bonded) is not specifically limited and includes those generally used for the photoelectric material. For example, it includes known semiconductors such as titanium oxide, zinc oxide, tungsten oxide, barium titanate, strontium titanate and cadmium sulfide. In the present invention, one or more may be selected from these semiconductors. In view of stability and safety, titanium oxide is a more preferable semiconductor material. Titanium oxide used in the present invention encompasses various titanium oxides in a narrow meaning such as anatase type titanium oxide, rutile type titanium oxide, amorphous titanium oxide, metatitanate and orthotitanate, and titanium hydroxide and titanium oxide hydrate. The semiconductor may be in the form of particles, a film and so on. It is especially preferable that a semiconductor film such as a titanium oxide film is formed on a conductive support body.

When the semiconductor film is formed on a substrate, a glass substrate, a plastic substrate or the like may be used, and particularly, a transparent substrate is preferred. The semiconductor film maybe formed on the substrate by various known methods. More specifically, a method in which a suspension containing semiconductor particles is applied to the substrate and dried and/or sintered, a method in which a semiconductor film is formed on the substrate by CVD, MOCVD or the like employing necessary raw material gas, PVD method, vapor deposition method or sputtering employing solid raw material, or sol-gel process may be applied The thickness of the semiconductor film formed is not specifically limited. Preferable thickness is 0–1 to 50 μm.

As the semiconductor particles, commercially available simple substance semiconductor particles or compound semiconductor particles having an appropriate average grain diameter within the range of 1 nm to 2000 nm, for example, may be used. The semiconductor particles may be suspended in an appropriate solvent for use. Such a solvent includes a glyme type solvent such as ethylene glycol monomethyl ether, alcohols such as isopropyl alcohol, alcohol based solvent mixture such as isopropyl alcohol/toluene, and water. The suspension of semiconductor particles is applied to the substrate, dried and sintered. The temperature, time, atmosphere and so on necessary for drying and sintering may be adjusted appropriately depending on the types of the substrate and the semiconductor particles used. For example, drying and sintering may be performed in ambient atmosphere or in inert gas atmosphere at a temperature in the range of about 50 to 800° C. for about 10 seconds to about 12 hours. Drying and sintering may be performed once at one temperature, or repeated twice or more with the temperature changed The raw material gas used for CVD, for example, to form the semiconductor film may be a single gas containing an element or elements constituting the semiconductor, or a mixture of two or more gases. The solid raw material used for PVD or the like to form the semiconductor film may be a single solid containing an element or elements constituting the semiconductor, a combination of a plurality of solids, or a solid of a compound.

To the surface of the obtained semiconductor, the photosensitising dye is attached. Prior to attachment of the dye, a process for activating the surface of the semiconductor may be optionally performed. In the step of attaching the photosensitising dye to the semiconductor, the dye is dissolved in one or more hydrophobic solvents, one or more aprotic solvents, one or more hydrophobic and aprotic solvents or a mixture thereof.

The hydrophobic solvent used in the present invention includes, for example, aliphatic hydrocarbon halides such as methylene chloride, chloroform and carbon tetrachloride; aliphatic hydrocarbons such as hexane and cyclohexane; aromatic hydrocarbons such as benzene, toluene, and xylene; aromatic hydrocarbon halides such as chlorobenzene and dichlorobenzene; esters such as ethyl acetate, butyl acetate and ethyl benzoate; and combinations thereof. The aprotic solvent used in the present invention includes, for example, ketones such as acetone and methyl ethyl ketone; ethers such as diethylether, diisopropylether and dimethoxyethane; nitrogen compounds such as acetonitrile, dimethylacetamide and hexamethylphosphoric triamid; sulfur compounds such as carbon disulfide and dimethyl sulfoxide; phosphorus compounds such as hexamethylphosphoramide; and combinations thereof. The hydrophobic and aprotic solvent used in the present invention includes, for example, aliphatic hydrocarbon halides such as chloroform, methylene chloride and carbon tetrachloride; aliphatic hydrocarbons such as hexane and cyclohexane; aromatic hydrocarbons such as benzene, toluene, and xylene; esters such as ethyl acetate, butyl acetate and ethyl benzoate; and combinations thereof. The dydrophobic solvent is more preferably employed in the present invention. More specifically, aliphatic hydrocarbons, aliphatic hydrocarbon halides, aromatic hydrocarbons, and aromatic hydrocarbon halides are more preferable as the hydrophobic solvent.

In the manufacturing method of the present invention, the photosensitising dye is dissolved in a hydrophobic and/or aprotic solvent The dye includes metal-free phthalocyanine dyes; cyanine dyes; merocyanine dyes; xanthene dyes such as rose bengal and Rhodamine B; triphenylmethane dyes such as Malachite Green and Crystal Violet; and metal complex salts such as metal phthalocyanes including copper phthalocyanine and titanyl phthalocyanine, chlorophyll, hemin, and complexes containing at least one of ruthenium, osmium, iron and zinc (see Japanese Patent Laying-Open No. 1-220380, and WO91/16719 and Japanese National Publication No. 5-504023 corresponding thereto).

The dye used as the photosensitiser in the present invention has an absorption spectrum in visible light range and, optionally, in infrared ray range. Accordingly, the dye generally has a maximum absorption wavelength $\lambda max$ between 400 nm and 1000 nm (400 nm<$\lambda max$<1000 nm)

In the preferred embodiment, the present invention is directed to the use of photosensitising dyes other than those disclosed in International Publication No. WO91/16719 and Japanese national Publication No. 5-504023 corresponding thereto and in International Publication No. WO94/05025. It has been found that the dyes as disclosed in the publications do not have good stability against light and, for example, decomposition of the adsorbed liquid of a bipyridyl ruthenium dye may proceed under room light. The inventors have found that when a dye having relatively high solubility in a hydrophobic and/or aprotic solvent is used, a material having relatively high photoelectric conversion eficiency can be obtained. The dyes preferably used in the present invention have, for example, azo structure, quinone structure, quinoneimine structure, quinacridone structure, squarilium structure, cyanine structure, merocyanine structure, triphenylmethane structure, xanthene structure, porphine structure, phthalocyanine structure, perylene structure, indigoid strucurure, napitlalocyanine structure, oxazine structure or anthraquinone structure. Therefore, azo dyes and derivatives thereof, quinone derivatives, quinoneimine dyes and derivatives thereof, quinacridone pigments and derivatives thereof, squarilium dyes and derivatives thereof, cyanine dyes and derivatives thereof, merocyanines and derivatives thereof, triphenylmethane dyes and deivatives thereof, xanthene dyes and derivatives thereof, porphine derivatives (porphyrins), phthalocyanines and derivatives thereof, perylen derivatives, indigoid dyes and derivatives thereof, naphthalocyanines and derivatives thereof, oxazine dyes and derivatives thereof, and anthraquinone dyes and derivatives thereof may preferably be used.

The dyes having metal complex structure has high quantum yield and high durability against light, and therefore they ale suitable for the photoelectric material. The metal complexes may have Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ti, Ir, Pd, Os, Ga, Tb, Eu, Rb, Bi Se, As, Sc, Ag, Cd, Hf, Re, Au, Ac, Tc, Te, Rh or the like. In view of environmental impact and waste water treatment in the manufacturing process, metal complexes having Cu, Al, Fe, Ti, Mg, Si, Zn, Sn or Ga is preferred. Especially, metal phthalocyanine complexes and metal-free phthalocyanine structure are more preferable as chromophore of the photosensitising dyes for solar cells, because they exhibit high photoelectric conversion efficiency and superior durability.

In a more preferred embodiment of the present invention, the photosensitising dye has at least one interlocking group and at least one hydrophobic group selected from the group consisting of monovalent substituted and unsubstituted aliphatic hydrocarbon groups and monovalent substituted and unsubstituted alicyclic hydrocarbon groups, wherein the hydrophobic group does not constitute a group directly bonded to metal. The interlocking group generally functions to strongly fix the dye to the semiconductor. The interlocking group may be selected from the group consisting of carboxyl group, hydroxyalkyl group, hydroxyl group, sulfonic acid group, carboxyalkyl group, mercapto group and phosphono group. The hydrophobic group of the dye serves to increase solubility of the dye in the hydrophobic and/or aprotic solvent. The substituted or unsubstituted aliphatic hydrocarbon group preferably has 3 to 20 carbon atoms, and more preferably, 3 to 12 carbon atoms. The substituted or unsubstituted alicyclic hydrocarbon group preferably has 3 to 12 carbon atoms and, more preferably, 5 to 12 carbon atoms. The solubility of the (dye in the hydrophobic and/or aprotic solvent can remarkably be improved when the number of carbon atoms in the hydrocarbon group is made 3 or more. Considering the fact that the larger the number of carbon atoms in the hydrocarbon group, the longer the distance between the dye molecules attached onto the surface of the semiconductor, the number of carbon atoms should preferably be at most 12. Particularly, it is preferred that the dye used in the present invention has an alkyl group. The alkyl group may be a straight or branched chain in which the number of carbons is 3 to 20, preferably 3 to 15 and more preferably, 3 to 12. The alkyl group includes, for example, methyl, ethyl, propyl, butyl, pentyl, hexyl, heptyl, octyl, nonyl, decyl, undecyl, dodecyl, tetradecyl, hexadecyl and the like. The substituent for the hydrocarbon group preferably includes, for example, halogens such as F, Cl and Br. The dye may have one or more hydrophobic groups.

The dyes preferably used in the present invention will be given in the following.

Phthalocyanines and derivatives thereof represented by the formula (I) or (II):

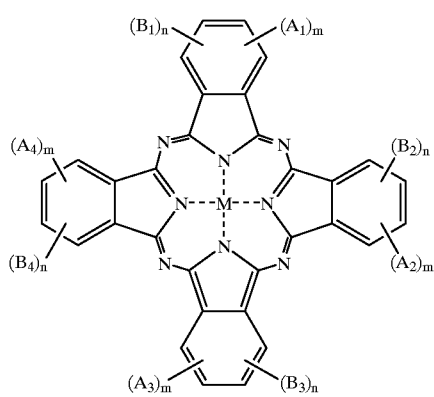

(I)

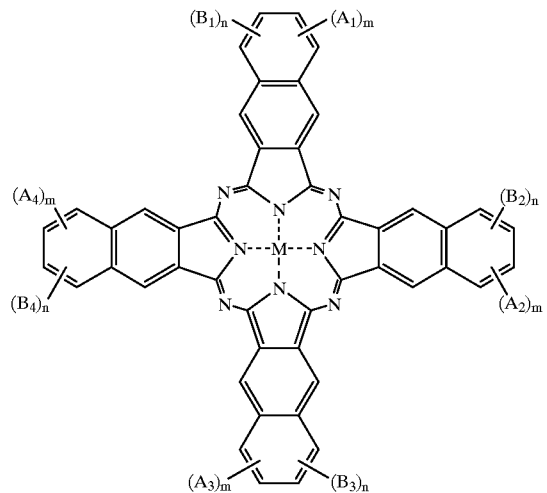

(II)

wherein $A_1$, $A_2$, $A_3$ and $A_4$ are independently selected from the group consisting of hydrogen, carboxyl group, hydroxyalkyl group, hydroxyl group, sulfonic acid group, carboxyalkyl group, mercapto group and phosphono group, and at least one of $A_1$, $A_2$, $A_3$ and $A_4$ is not hydrogen; $B_1$, $B_2$, $B_3$ and $B_4$ are selected from the group consisting of —R, —OR —CH$_2$OR, —SR, —OCOR, —COR, —CONRR' and —NRR' (where R and R' are the same or different hydrophobic groups selected from the group consisting of substituted and unsubstituted aliphatic hydrocarbon groups with 3 to 12 carbon atoms and substituted and unsubstituted alicyclic hydrocarbon groups); n and m independently represent an integer of 0, 1, 2, 3 or 4, where n+m is at most 4; and M represents two hydrogen atoms, or an atom or a compound which may be covalently bonded or coordinately bonded to phthalocyanine.

In the formula (I) or (II), M is preferably represented by two hydrogen atoms, Cu, VO, Co, TiO, Fe, AlCl, Mg, Sn, SnO, Pb, Zn or Si(OR)$_2$ (where R represents alkyl, preferably $C_{1-4}$ alyl, aryl, or preferably $C_{7-12}$ aryl). The dye represented by the formula (I) or (II) is soluble in a hydrophobic and/or aprotic solvent in a concentration of $5 \times 10^{-5}$ to $1 \times 10^{-2}$ mol/liter.

Indigoid dyes and derivatives thereof represented by the formula (III):

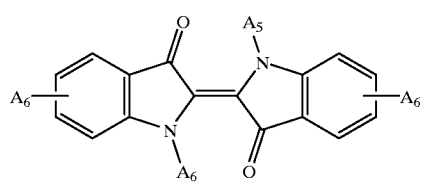

(III)

wherein $A_5$ is selected from the group consisting of —R and —COR (where R is selected from the group consisting of substituted and unsubstituted aliphatic hydrocarbon groups with 3–12 carbon atoms and substituted and unsubstituted alicyclic hydrocarbon group), and $A_6$ is selected from the group consisting of carboxyl group, hydoxyalkyl group, hydroxyl group, sulfonic acid group, carboxyalayl group, mercapto group and phosphono group.

Quinacridone pigments and derivatives thereof represented by the formula (IV):

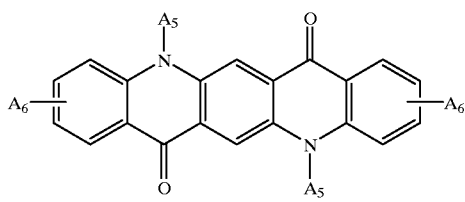

(IV)

wherein the definitions of $A_5$ and $A_6$ are the same as in formula (III).

Oxazine dyes and derivatives thereof represented by the formula (V):

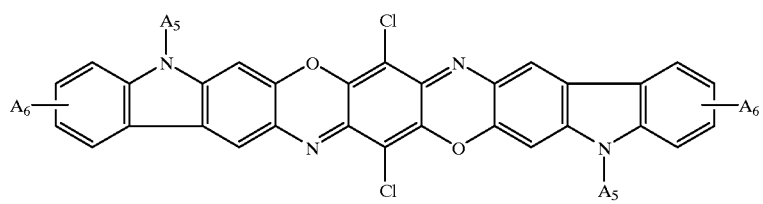

(V)

wherein the definitions of $A_5$ and $A_6$ are the same as in formula (III).

Cyanine dyes and derivatives thereof represented by the formula (VI):

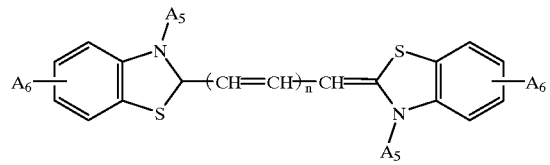

(VI)

wherein the definitions of $A_5$ and $A_6$ are the same as in the formula (III).

Squarilium dyes and derivatives thereof represented by the formula (VII):

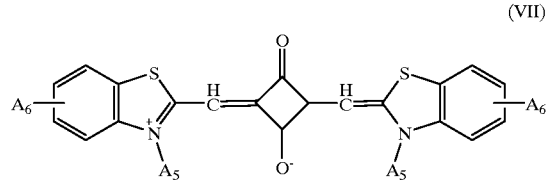

(VII)

wherein the definitions of $A_5$ and $A_6$ are the same as in the formula (III).

Anthraquinone dyes and derivatives thereof represented by the formula (VIII):

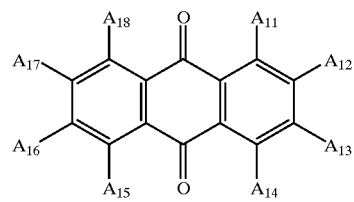

(VIII)

wherein $A_{11}$, $A_{12}$, $A_{13}$, $A_{14}$, $A_{15}$, $A_{16}$, $A_{17}$ and $A_{18}$ are selected from the group consisting of hydrogen, Cl, Br, F, —R, —OR, —NRR', —NCOR (where R and R' are selected from the group consisting of substituted and unsubstituted aliphatic hydrocarbon groups with 3–12 carbon atoms and substituted and unsubstituted alicyclic hydrocarbon groups), and the interlocking groups selected from the group consisting of carboxyl group, hydxoxyalkyl group, hydroxyl group, sulfonic acid group, carboxyalkyl group, mercapto group and phosphono group, at least one of $A_{11}$ to $A_{18}$ is the interlocking group, and at least one of $A_{11}$ to $A_{18}$ is selected from the group consisting of —R, —OR, —NRR' and —NCOR.

Xanthene dyes and derivatives thereof represented by the formula (IX):

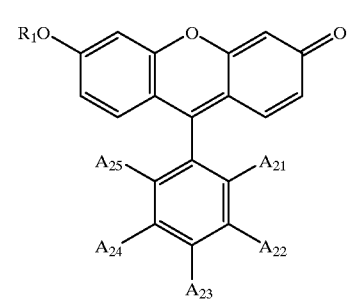

(IX)

wherein $R_1$ is selected from the group consisting of substituted and unsubstituted aliphatic hydrocarbon groups with 3–12 carbon atoms and substituted and unsubstituted alicyclic hydrocarbon groups, $A_{21}$, $A_{22}$, $A_{23}$, $A_{24}$ and $A_{25}$ are selected from the group consisting of hydrogen, Cl, Br, F, carboxyl group, sulfonic acid group, carboxyalkyl group and phosphono group, and at least one of $A_{21}$ to $A_{25}$ is selected from the group consisting of carboxyl group, sulfonic add group, carboxyalkyl group and phosphono group.

Metal complexes represented by the formula (X):

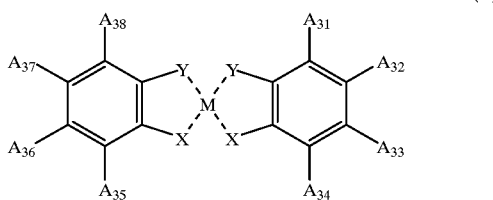

wherein M is selected from the group consisting of Ni, Pt and Cu, X and Y are selected from the group consisting of $NH_2$, NH, S and Se, and $A_{31}$, $A_{32}$, $A_{33}$, $A_{34}$, $A_{35}$, $A_{36}$, $A_{37}$ and $A_{38}$ are selected from the group consisting of hydrogen, Cl, Br, F, —R, —OR, —NRR', —NCOR (where R and R' are the same or different hydrophobic groups selected from the group consisting of substituted and unsubstituted aliphatic hydrocarbon groups with 3–12 carbon atoms and substituted and unsubstituted alicyclic hydrocarbon groups), and the interlocking groups selected from the group consisting of carboxyl group, hydroxyalkyl group, hydroxyl group, sulfonic acid group, carboxyalkyl group, mercapto group and phosphono group, at least one of $A_{31}$ to $A_{38}$ is the interlocking group, and at least one of $A_{31}$ to $A_{38}$ is selected from the group consisting of —R, —OR, —NRR' and —NCOR.

The photosensitising dye used in the present invention may be selected from commercially available products having an appropriate interlocking group and an appropriate hydrophobic group. In most cases, however, commercially available organic pigments do not have either of or both of the necessary interlocking group and the necessary hydrophobic group. Accordingly, it is preferred to obtain the photosensitising dye by modifying commercially available organic pigments or organic pigments obtained by conventional technique, or by employing suitable scheme of synthesis. The method of modifying the generally available pigments includes the step of introducing either of or both of the necessary interlocking group and hydrophobic group. When a generally available dye has a suitable hydrophobic group, a suitable interlocking group may be introduced. When the generally available dye has a suitable interlocking group, the hydrophobic group may also be introduced into it.

On the other hand, a suitable hydrophobic group and an interlocking group may be introduced into the generally available dye, respectively. Generally, the introduction reaction takes place in an organic solvent or a non-polar solvent. Considering the solubility of the dye in the solvent, therefore, it is advantageous to introduce the interlocking group into the dye which naturally has or is already provided with the hydrophobic group. Alternatively, the dye may be synthesized from an intermediate into which the hydrophobic group and/or the interlocking group has been introduced. It is preferred, for example, to synthesize a dye skeleton from an intermediate into which the hydrophobic group has been introduced, and thereafter to introduce the interlocking group.

Phthalocyanine derivatives having the interlocking group and the hydrophobic group are preferably synthesized from an intermediate having a hydrophobic group, as will be described later.

According to the following scheme, one of the interlocking groups COOH may be introduced into the dyes or intermediates thereof.

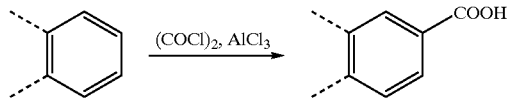

In the scheme, $AlCl_3$ is dissolved in carbon disulfide and cooled. Oxalyl chloride is added slowly to the solution. The dye material dissolved in carbon disulfide is dropped to the carbon disulfide solution containing the oxalyl chloride and $AlCl_3$ under cooling. After an appropriate reaction time period, a product having one or more carboxyl groups is obtained through an appropriate step of separation. Such a scheme is applicable to the synthesis of the photosensitising dyes described above.

Some examples of introduction of the carboxyl group into the above described dyes are shown below.

According to the following scheme, the carboxyl group may be introduced into phthalocyanine derivatives having an appropriate hydrophobic group.

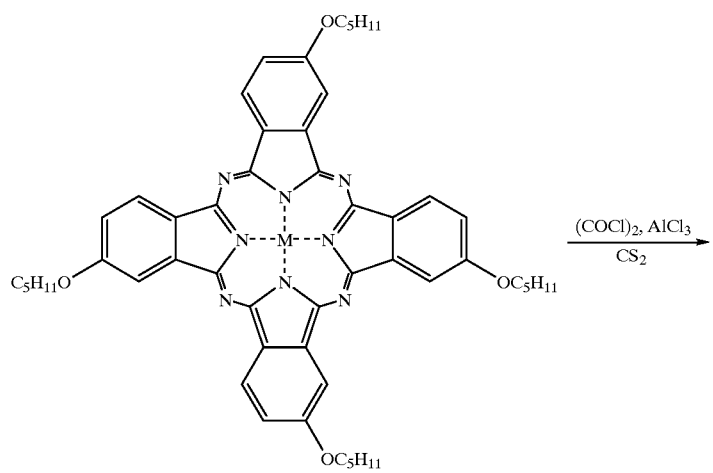

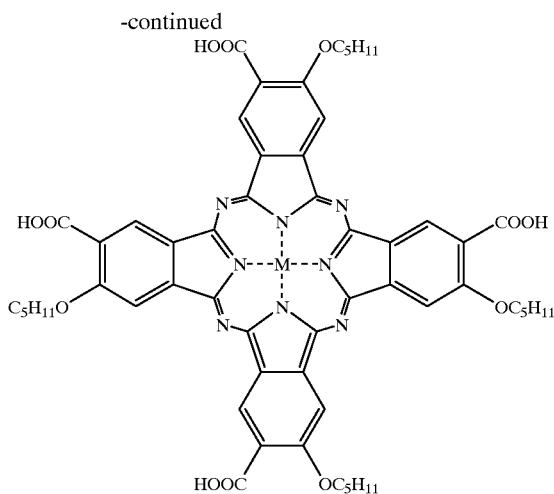

According to the following formula, the interlocking group may be introduced into indigoid derivatives into which the hydrophobic group has been introduced.

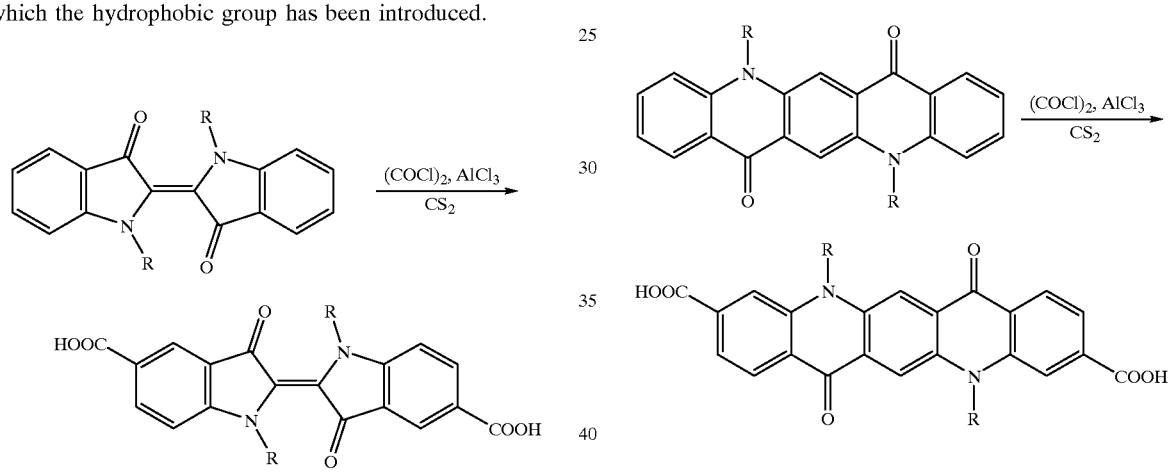

According to the following formula, the interlocking group may be introduced into quinacridone derivatives into which the hydrophobic group has been introduced.

According to the following formula, the interlocking group may be introduced into dioxazine derivatives into which a hydrophobic group has been introduced.

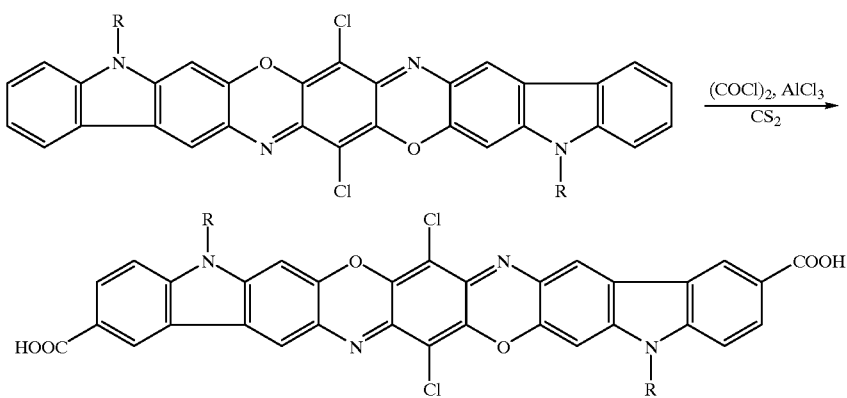

According to the following scheme, one of the interlocking groups SO$_3$H may be introduced into the dyes or intermediates thereof.

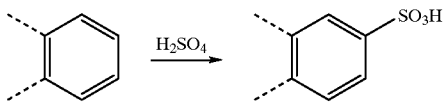

In the schemes the material is slowly added to concentrated sulfuric acid under stirring. After one hour of the reaction at 80° C., the reaction mixture is poured into ice water. After filtration, the obtained solid is neutralized with an aqueous alkali solution, and then filtration and drying give a product having one or more sulfonic acid groups. This reaction may also be applicable to the synthesis of the photosensitising dyes described above.

The reaction represented by the following formulas can be utilized to obtain a dye or an intermediate therefor having the hydrophobic group such as an alkyl group.

1) Friedel-Crafts Reaction

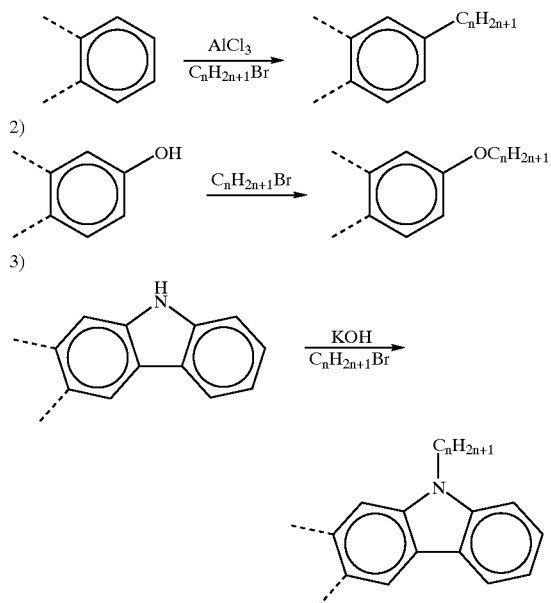

2)

3)

In the present invention, the photosensitising dye is dissolved in a hydrophobic and/or aprotic solvent. An appropriate organic solvent such as described above is used as the solvent. Preferably, a solvent purified in accordance with a common method is used. Prior to the use of solvent, distillation and/or drying may be performed as needed, to obtain a solvent of higher purity. In the present invention, the dye is soluble in a hydrophobic and/or aprotic solvent in a concentration of at least $1\times10^{-5}$ mol/liter, preferably in a concentration of $5\times10^{-5}$ to $1\times10^{-2}$ mol/liter. The concentration of the dye in the solvent may be adjusted depending on the types of the dye and the solvent, and conditions for the process of attaching the dye.

In order to attach the dye to the semiconductor, the dye solution is brought into contact with the semiconductor. Attachment of the dye may be attained by dipping the semiconductor into the dye solution, or by applying the dye solution to the semiconductor. In the dipping process, the dye solution is placed in a suitable container which can accommodate the semiconductor, and the semiconductor is dipped entirely into the solution or only a desired portion of the semiconductor is dipped into the solution, and kept for a preyed time period. Dipping may be performed at room temperature under atmospheric pressure. However, the process condition is not limited thereto, and temperatures of the solution and the atmosphere as well as the pressure may be changed. The time of dipping may be about 5 minutes to about 96 hours. However, the time is not specifically limited. The time of dipping may be adjusted depending on the types of the dye and the solvent used as well as the concentration of solution. Dipping may be performed once or plural times. According to the present invention, a solution containing the dye in a sufficient concentration is obtained, and therefore sufficient amount of dye can be attached to the semiconductor by dipping the semiconductor into the dye solution. A process for increasing the concentration of the dye existing on the semiconductor may optionally be performed. After the step of dipping or application, drying may be performed as needed. The dye adsorbed in the semiconductor by the above described method functions as a photosensitiser to feed electrons to the semiconductor, by the optical energy. Generally, the dye is fixed to the semiconductor by the interlocking group. The interlocking group provides electrical coupling which facilitates movement of electrons between the dye in the excited state and a conductive band of the semiconductor.

The photoelectric material in accordance with the present invention is applied to a photoelectric device such as a solar cell, an optical switching device, and a sensor. According to the present invention, a solar cell as shown in FIG. 1 is provided. In the solar cell, semiconductor layer 5 of titanium oxide, for example, is formed on support body 7 which is a glass plate coated with transparent conductive film 6, for example. Photosensitising dye 4 is attached to the surface of semiconductor layer 5. By depositing conductive film 6, semiconductor layer 5 and dye 4 in this order on support body 7, an electrode is obtained. The counter electrode has support body 1 such as a glass plate, and a transparent conductive film coated thereon. Electrolyte 3 is filled between the electrodes, and thus the solar cell is completed. To the semiconductor layer formed on the support body, the dye is attached as described above, to obtain the photoelectric material. By combining the obtained photoelectric material with the conductive film and the electrolyte, the solar cell as the photoelectric device is obtained. The conductive film is not specifically limited, and preferably, it is composed of a transparent conductive material such as ITO or SnO$_2$. The conductive film may be formed by a common method. As to the electrolyte, those commonly used for the wet type solar cell may preferably be used.

When the dye in the solar cell is irradiated with sunlight, the dye absorbs light in the visible light range, and is excited. Electrons generated by the excitation move to semiconductor layer 5, and further through transparent conductive film 6 to transparent conductive film 2 of the counter electrode. By the electrons which have moved to the counter electrode, the oxidation-reduction system in electrolyte 3 is reduced. The dye 4 from which electrons are moved to the semiconductor is in an oxidated state. The oxidated state is reduced by the oxidation-reduction system in the electrolyte and is returned to the original state. Through the flow of electrons in this process, optical energy is continuously converted to electric energy.

In the following, the present invention will be described in greater detail with reference to examples. The present invention, however, is not limited thereto.

EXAMPLES

Example 1

Preparation of Titanium Oxide Porous Film

Commercially available titanium oxide particles (4.0 g) TEIKA Corporation, trade name AMT-600, anatase type crystal, 30 nm of average grain diameter, 50 m²/g of specific surface area) was dispersed together with glass beads in ethylene glycol monomethyl ether (20 ml) for 6 hours by a paint shaker, and titanium oxide suspension was obtained. The titanium oxide suspension was applied to a glass plate by doctor blade process, pre-dried for 30 minutes at 300° C., and thereafter sintered for 40 minutes at 500° C., and thus a titanium oxide film was obtained.

Preparation of Photosensitiser Phthalocyanine Derivative

A phthalocyamine derivative was obtained according to with the following synthetic scheme.

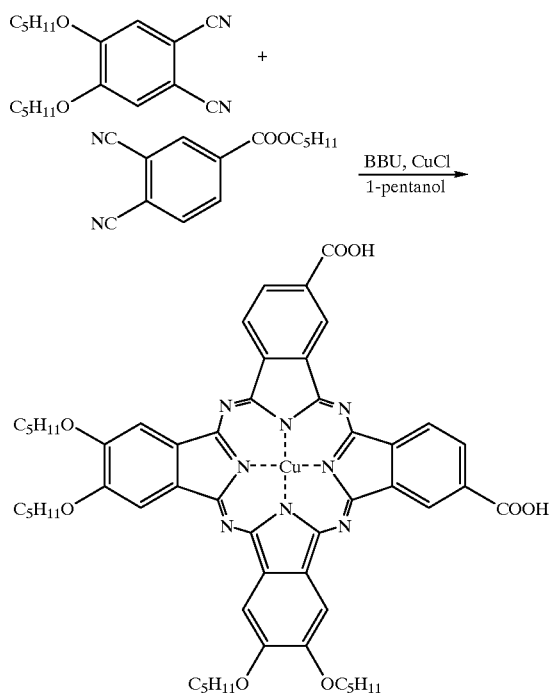

Dipentoxydinitrile benzene (0.75 g, 2.5 mmol), dinitrile pentyl benzoate (0.6 g, 2.5 mmol) and CuCl (0.124 g 1.26 mmol) were added to anhydrous 1-pentanol (20 ml) and refluxed under flow of argon gas, DBU (0.76 g, 5.0 mmol) was added slowly drop wise thereto, and then reflux was carried out for 7 hours. After the reaction was completed, the reaction mixture was cooled to room temperature, $K_2CO_3$ was added thereto and the mixture was stirred overnight. The reaction mixture was filtered, and the solvent in the filtrate was evaporated, whereby a blue solid was obtained. The solid was purified by column chromatography (methylene chloride: methanol). Recrystallization of the product from 2-propanol gave 0.5 g of phthalocyanine derivative (yield: 45%)

IR(KBr):2940, 2870(C—H), 1095(C—O), 1689(C=O) cm$^{-1}$; Elementary Analysis: $C_{54}H_{59}N_8O_8Cu$

|  | C | H | N |
|---|---|---|---|
| Calculated (%) | 64.3 | 5.60 | 11.1 |
| Determined (%) | 64.5 | 5.81 | 11.1 |

Preparation of Photoelectric Material

The obtained phthalocyanine derivative was dissolved in chloroform. The concentration of the dye in the solution was $5 \times 10^{-4}$ mol/liter. Thereafter, the glass plate coated with the titanium oxide film was held in the dye solution for 30 minutes, and the dye was attached to the titanium oxide film. In this manner, the photoelectric material having the dye attached to the titanim oxide semiconductor film was obtained.

Preparation of Solar Cell

The obtained photoelectric material was used as one electrode, and a transparent conductive glass plate with a platinum layer was used as the counter electrode. An electrolyte was inserted between the two electrodes, and the sides thereof were sealed by a resin. Leads were attached to the respective electrodes, and a solar cell was obtained. The electrolyte was the prepared by dissolving tetrapropylammonium iodide and iodine in concentrations of 0.46 mol/l and 0.06 mol/l respectively into a mixed solvent of acetonitrile/ethylene carbonate (1:4 by volume). The obtained solar cell was irradiated with light having an intensity of 100 W/m² (AM1.5 solar simulator), and resulting η (conversion efficiency) was 5.4%. This result proves that the solar cell in accordance with the present invention is effective. The conversion efficiency was not reduced even after one year with the solar cell irradiated with light for 8 hours everyday by the solar simulator.

Comparative Example 1

A photoelectric material and a solar cell were prepared in a similar manner as in Example 1 except that ethanol was used as the solvent and phthalocyanine represented by the following formula was used as the dye, in preparing the photoelectric material.

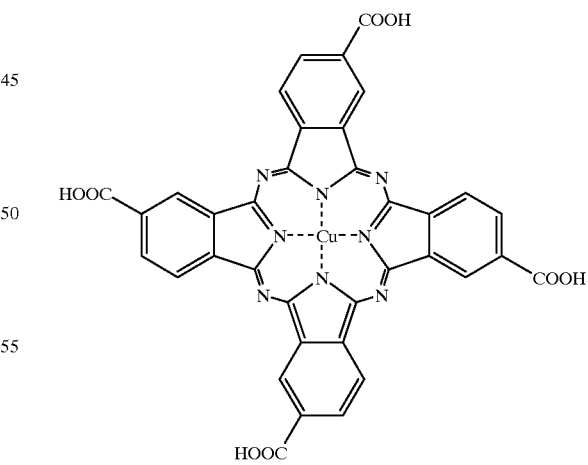

The obtained solar cell was irradiated with light having an intensity of 100 W/m² by solar simulator, and η was 1.1%.

Example 2

Synthesis of Photosensitising Dye

A phthalocyanine derivative was synthesized in accordance with the following scheme.

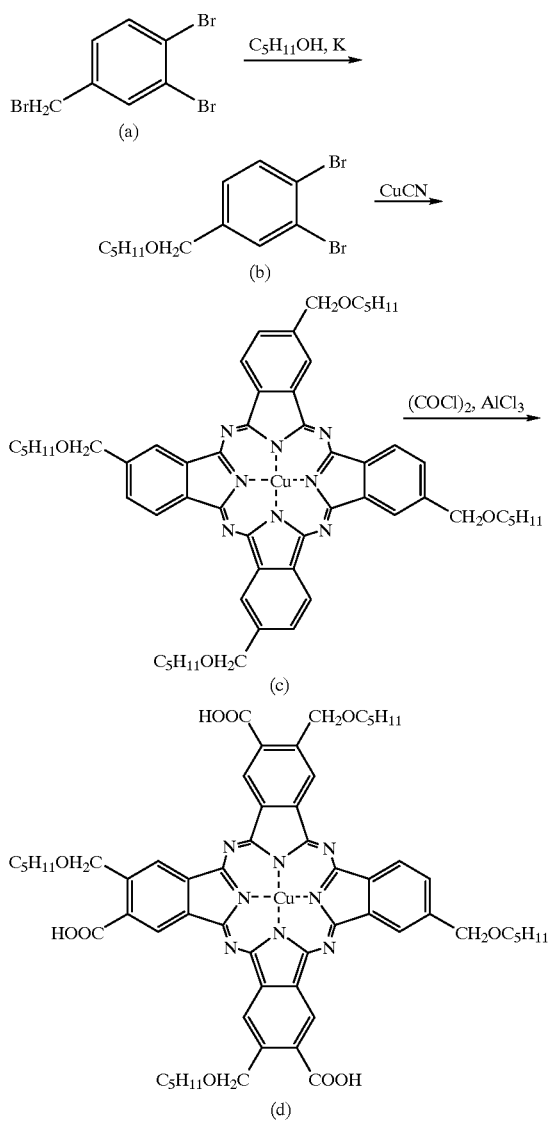

Synthesis of Intermediate b t-Butanol (80 ml) and n-pentanol (10 ml) were added into a 200 ml flask, and stirred while potassium (2.5 g) was added slowly. After the potassium was completely dissolved, compound a (9.2 g, 0.028 mol) was added thereto. Reflux was carried out for 5 hours while stirring. The reaction mixture was cooled to room temperature, and 30% sodium chloride solution (50 ml) was added thereto, and the reaction mixture was extracted with chloroform. Chloroform was evaporated, hexane was then added to the residue, the mixture was filtered and insoluble materials were removed The filtrate was purified by column chromatogralphy (hexane:ethyl acetate=25:1) to give 4.7 g of yellow liquid (yield: 50%).

NMR(CDCl$_3$); δ=7.64 (3H); δ=4.45 (s, 2H); δ=3.46 (t, 2H); δ=1.60 (m, 2H); δ=1.28 (m, 4H); δ=0.88 (t, 3H)

Synthesis of Phthalocyanine Derivative c

The intermediate b (3.4 g, 0.01 mol), an excess of CuCN (4.5 g, 0.05 mol) and DMF (20 ml) were added into a 50 ml flask, and reflux was carried out for 8 hours. The mixture was cooled to room temperature, aqueous ammonia (50 ml) was pored thereto, and the mixture was stirred for 20 minutes and filtered. Resulting solid was washed with water until neutralized, and then extracted with hexane. Resulting dark green solid was purified by column chromatography (chloroform), and blue solid c (1.1 g) was obtained (yield: 45%).

IR(KBr): ν=2860/2940 cm$^{-1}$ (C—H); 1100 cm$^{-1}$ (C—O)

Synthesization of Phthalocyanine Derivative d

AlCl$_3$ (0.15 g, 1.1 mmol) was dissolved in carbon disulfide (10 ml) and cooled to 10° C. Oxalyl chloride (0.14 g, 1.1 mmol) was added slowly thereto. Phthalocyanine derivative c (0.98 g, 1 mmol) dissolved in carbon disulfide (5 ml) was added dropwise to the solution containing the AlCl$_3$ and oxalyl chloide while keeping the liquid temperature to be lower than 10° C., reaction was carried out for 2 hours and, then, the reaction mixture was added to ice water (100 ml), neutralized with hydrochloric acid, and extracted with carbon tetrachloride. Phthalocyanine derivative d (0.58 g) was obtained (yield: 50%).

IR(KBr): ν=2860/2940 cm$^{-1}$(C—H); 1100 cm$^{-1}$(C—O); 1690cm$^{-1}$(C=O)

Preparation of Photoelectric Material and Solar Cell

A photoelectric material and a solar cell were prepared in a similar manner as in Example 1 except that phthalocyanine derivative d was used as the photosensitiser. The resulting solar cell was irradiated with light having an intensity of 100 W/m$^2$ by solar simulator, and η was 4.7%.

Example 3

Synthesis of Photosensitiser

A photosensitiser was synthesized in accordance with the following scheme.

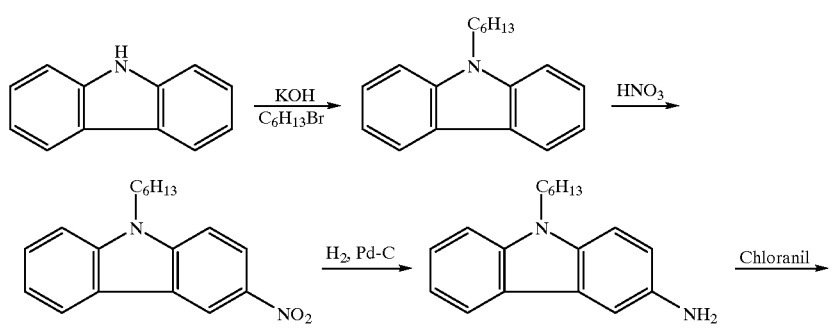

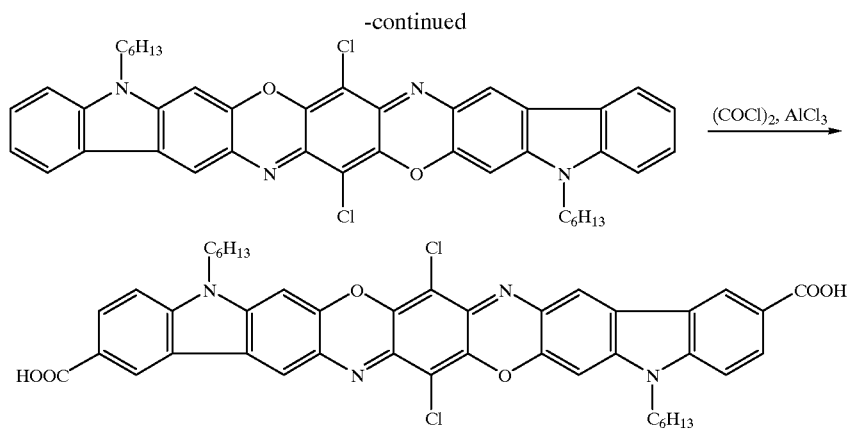

Carbazole (23.66 g, 0.16 mol), potassium hydroxide (14.45 g. 0.226 mol), water (30 g) and line (100 g) were added into a 500 ml four neck flask equipped with Dean-stark apparatus, and refluxed. Water (about 30 g) was separated, and the reaction mixture was cooled to 90 to 100° C. Hexyl bromide (33 g, 0.2 mol) was added dropwise thereto over about 25 minutes, and then reflux was carried out for 1 hour. 9-hexylcarbazole was obtained in a 95% yield.

The temperature of the reaction liquid was controlled to be maintained at 70° C., and 35.86 g (0.403 mol) of 70.8% nitric acid and equivalent water were added slowly to prevent a temperature increase. Reaction was carried out for 1 hour at this temperature, and then 20 g (0.375 mol) of 86.7% potassium hydroxide dissolved in 50 ml of water was added. 3-nitro-9-hexylcarbazole was obtained in a 90% yield (GC analysis).

The temperature of the reaction liquid was kept to be 60° C. or higher, 250 g of xylene was added, and the liquid was washed several times with 400 ml of hot water at about 70° C. Into the liquid, 1.0 g of Pd-C (5%) was added and the resulting mixture was reduced with hydrogen in an autoclave. The reaction mixture was filtered, the filtrate was evaporated, and 34.5 g of 3-amino-9-hexylcarbazole was obtained (yield:90%).

NMR(CDCl$_3$):$\delta$=6.54–7.74 (m, 7H); $\delta$=4.10 (t, 2H); $\delta$=3.35 (b, 2H)

3-amino-9-hexylcarbazole (20.3 g, 0.09 mol) and triethylmine (10.3 g) were added to o-dichlorobenzene (300 g), and chloranil (15 g, 0.61 mol) was added thereto over 1 hour at 25 to 35° C. After the reaction for 1 hour at 25 to 35° C., benzenesulfonyl (12 g, 0.067 mol) was added to the reaction mixture, and refluxed for 2 hours. The solvent was evaporated, and recrystallization of the residue from chloroform gave 24 g of dioxazine (yield: 75%).

AlCl$_3$ (0.15 g, 1.1 mmol) was dissolved in carbon disulfide (10 ml) and cooled to 10° C. Oxalyl chloride (0.14 g, 1.1 mmol) was added slowly thereto. Dioxazine (0.7 g, 1 mmol) dissolved in 5 ml of carbon disulfide was added dropwise to the solution containing the AlCl$_3$ and oxalyl chloride, reaction was carried out for 2 hours and the reaction mixture was added to 100 ml of ice water, neutralized with hydrochloric acid, and extracted with carbon tetrachloride. Dioxazine derivative (0.45 g) was obtained (yield: 57%).

Preparation of Photoelectric Material and Solar Cell

A photoelectric material and a solar cell were prepared in a similar manner as in Example 1, except that the obtained dioxazine derivative was used as the photosensitiser. The obtained solar cell was irradiated with light having an intensity of 100 W/m$^2$ by solar simulator, and $\eta$ was 4.5%.

Example 4

An indigo derivative was obtained in accordance with the following scheme.

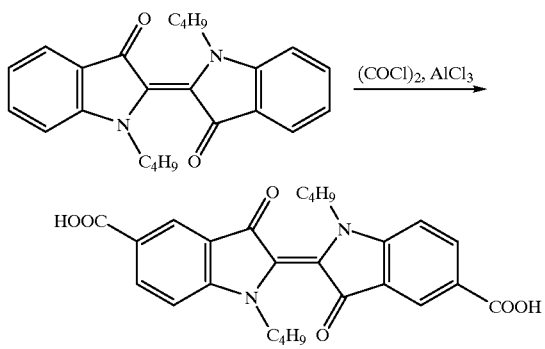

Carboxyl groups were introduced using the similar method as in the synthesis of phthalocyanine derivative d. A photoelectric material and a solar cell were obtained in a similar manner as in Example 1, except that the indigo derivative was used as the photosensitiser. The obtained solar cell was irradiated with light having an intensity of 100 W/m$^2$ by solar simulator, and $\eta$ was 4.1%.

Example 5

The dye represented by the following formula was used as the photosensitiser.

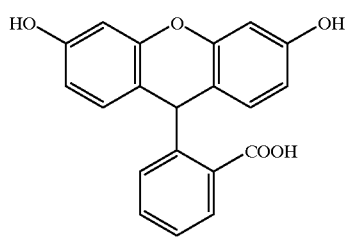

The dye was dissolved in acetone in a concentration of $2\times10^{-4}$ mol/liter. A photoelectric material and a solar cell were prepared in a similar manner as in Example 1. except that the dye solution was used The obtained solar cell was irradiated with light having an intensity of 100 W/m$^2$ by solar simulator, and $\eta$ was 2.1%.

Comparative Example 2

A photoelectric material and a solar cell were prepared in a similar manner as in Example 5 except that methanol was used as a solvent for the dye solution. The resulting η of the obtained solar cell was 1.1%.

Example 6

A titanium oxide suspension was prepared in a similar manner as in Example 1. Thereafter, the titanium oxide suspension was applied to a glass plate in a thickness of about 10 μm in accordance with the doctor blade process, and pre-dried for 30 minutes at 300° C., and then sintered for 40 minutes at 500° C., whereby a titanium oxide film having a thickness of about 8 μm was obtained.

A phthalocyanine derivative was obtained in accordance with the following scheme.

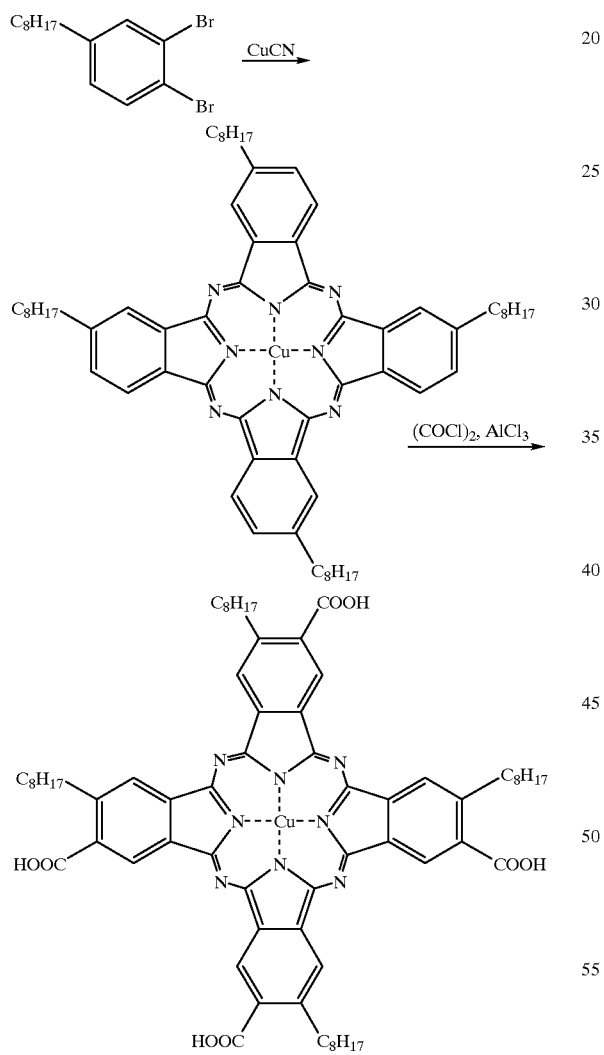

The obtained dye was dissolved in acetonitrile in a concentration of $2 \times 10^{-4}$ mol/liter. Thereafter, using the dye solution, a photoelectric material and a solar cell were prepared in a similar manner as in Example 1. The obtained solar cell was irradiated with light having the intensity of 100 W/m² by solar simulator, and η was 4.1%.

Comparative Example 3

A photoelectric material and a solar cell were prepared in a similar manner as in Example 1, except that the dye represented by the following formula was dissolved in ethanol.

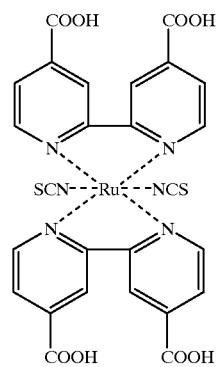

The obtained solar cell was irradiated with light having the intensity of 100 W/m² by a solar simulator, and η was 1.8%.

Example 7

A phthalocyanine derivative was obtained in accordance with the below scheme.

The obtained phthalocyanine derivative was dissolved in hexane in a concentration of $5 \times 10^{-4}$ mol/liter. Using the solution, a photoelectric material and a solar cell were obtained in a similar manner as in Example 6. The obtained solar cell was irradiated with light having an intensity of 100 W/m² by a solar simulator, and η was 2.7%.

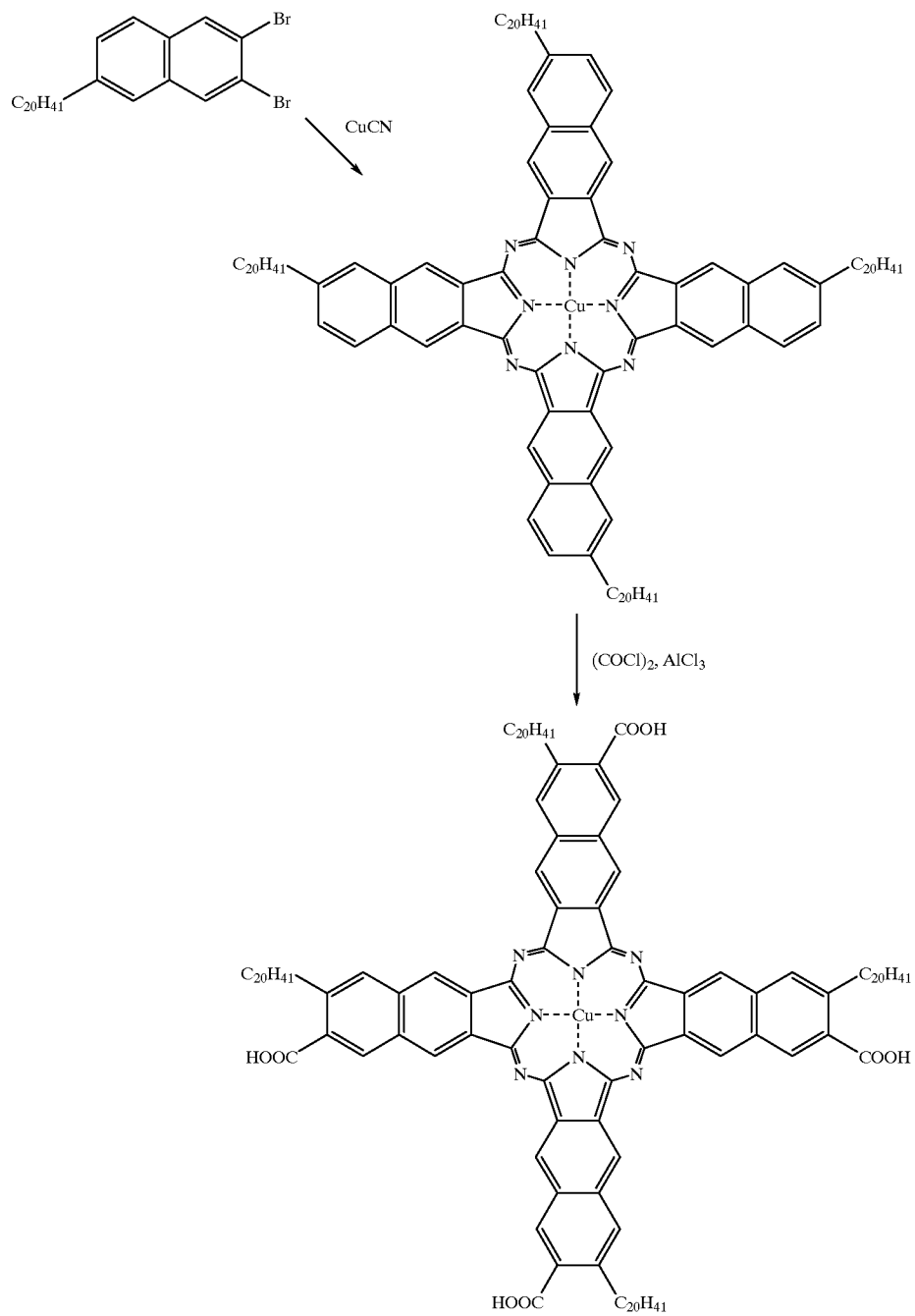
Example 8
A phthalocyanine derivative was obtained in accordance with the following scheme.
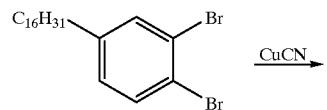

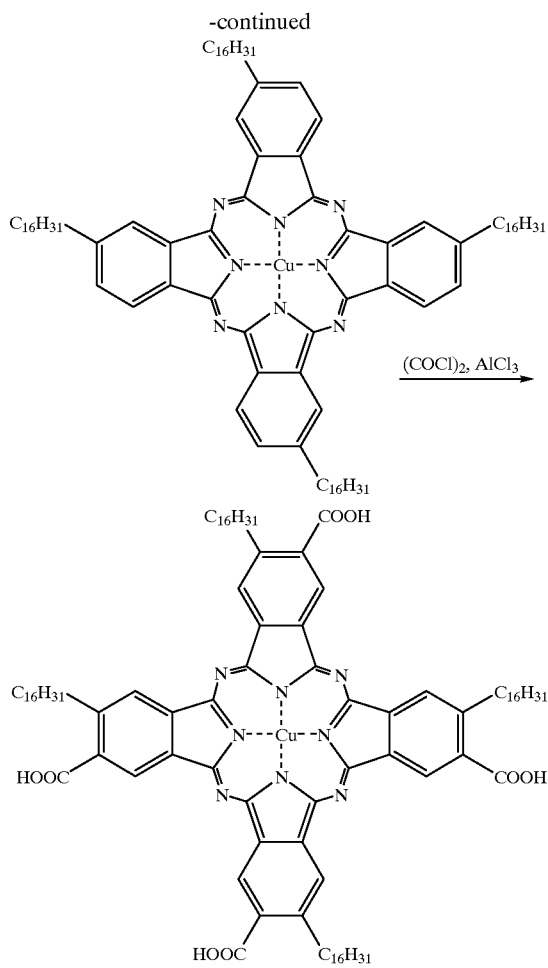

The obtained phthalocyanine derivative was dissolved in ethyl acetate in a concentration of $5 \times 10^{-4}$ mol/liter. Using the obtained dye solution, a photoelectric material and a solar cell were prepared in a similar manner as in Example 6. The obtained solar cell was irradiated with light having an intensity of 100 W/m² by solar simulator, and η was 2.9%.

In the present invention, the hydrophobic and/or aprotic solvent used for dissolving the photosensitising dye can eliminate adverse influence of water and/or proton to the semiconductor surface and, as a result, ensures attachment of sufficient amount of dye to the semiconductor surface. The factors which prevent the attachment of the dye to the semiconductor surface are removed, so that materials and devices having high photoelectric conversion efficiency can be obtained. The present invention, highly efficient photoelectric material and device can provide at a low cost through simple manufacturing steps. The photosensitising dye having at least one interlocking group and at least one hydrophobic group in accordance with the present invention is dissolved in a relatively high concentration into the hydrophobic and/or aprotic solvent. Such a dye having the hydrophobic group can be attached in a high concentration to the semiconductor, by use of an appropriate hydrophobic and/or aprotic solvent. Accordingly, the present invention provides an photoelectric material having high efficiency. Such material is useful for various photoelectric devices. Further, use of the hydrophobic solvent in manufacturing the photoelectric material prevents water contamination, and protects the semiconductor from water. As a result, highly durable photoelectric material can be obtained. The photoelectric material in accordance with the present invention is especially useful for solar cells, and allows production of solar cells which are inexpensive and have high photoelectric conversion efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoelectric material, comprising:
    a semiconductor; and
    an organic photosensitising dye attached to said semiconductor; wherein
    said dye has at least one interlocking group directly bonded to one of the atoms forming a conjugated double bond system in the chromophore of said dye, and at least one hydrophobic group selected from the group consisting of monovalent substituted and unsubstituted alicyclic hydrocarbon groups,
    if said dye has a metal, said hydrophobic group does not constitute a group directly bonded to said metal, and
    said dye is not any of transition metal complexes comprising a ligand with a pyridyl group, transition metal complexes comprising a ligand with N,N,N',N'-tetra $C_{1-4}$ alkyl ethylene diamine and transition metal complexes comprising a ligand with di-$C_{1-4}$ alkyl glyoxime.

2. The photoelectric material according to claim 1, wherein said semiconductor is titanium oxide.

3. The photoelectric material according to claim 1, wherein said dye is a compound having at least one structure selected from the group consisting of azo structure, quinone structure, quinoneimine structure, quinacridone structure, squarilium structure, cyanine structure, merocyanine structure, triphenylmethane structure, xanthene structure, porphine structure, phthalocyanine structure, perylene structure, indigoid structure, naphthalocyanine structure, oxazine structure and anthraquinone structure.

4. A method of manufacturing the photoelectric material according to claim 3, comprising the steps of:
    dissolving said dye in a hydrophobic and/or aprotic solvent; and
    attaching said dye to said semiconductor by bringing said solvent containing said dye into contact with said semiconductor.

5. The photoelectric material according to claim 1, wherein said dye is represented by one formula selected from the group consisting of:

the formula:

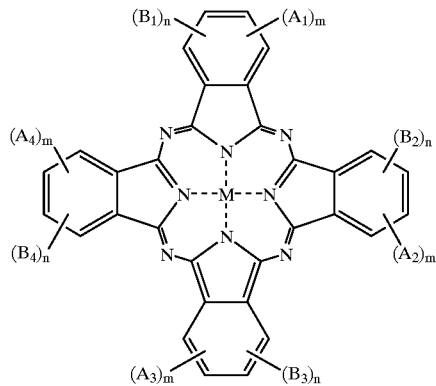

(I)

wherein $A_1$, $A_2$, $A_3$ and $A_4$ are independently selected from the group consisting of hydrogen, carboxyl group, hydroxyalkyl group, hydroxyl group, sulfonic add group, carboxyalkyl group, mercapto group and phosphono group, and at least one of $A_1$, $A_2$, $A_3$ and $A_4$ is not hydrogen; $B_1$, $B_2$, $B_3$ and $B_4$ are selected from the group consisting of —R, —OR, —CH$_2$OR, —SR, —OCOR, —COR, —CONRR' and —NRR' (where R and R' are the same or different hydrophobic groups selected from the group consisting of substituted and unsubstituted aliphatic hydrocarbon groups with 3 to 12 carbon atoms and substituted and unsubstituted alicyclic hydrocarbon groups); n and m independently represent an integer of 0, 1, 2, 3 or 4, where n+m is at most 4; and M represents two hydrogen atoms, or an atom or a compound which may be covalently bonded or coordinately bonded to phthalocyanine, the formula:

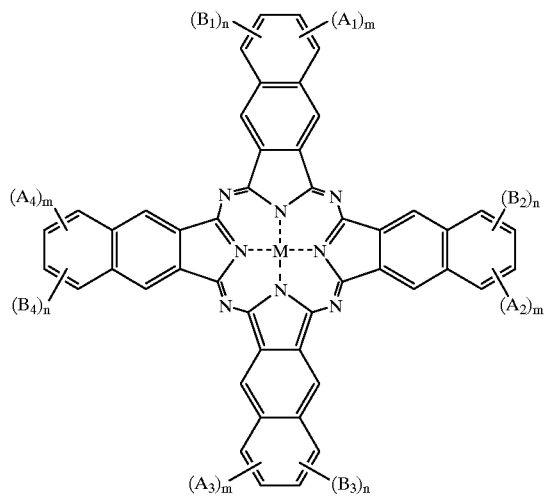

(II)

wherein the definitions of $A_1$, $A_2$, $A_3$, $A_4$, $B_1$, $B_2$, $B_3$, $B_4$, n and m are the same as defined above, the formula:

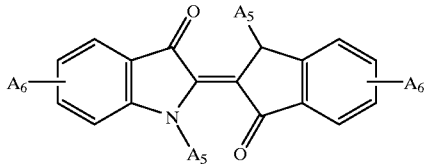

(III)

wherein $A_5$ is selected from the group consisting of —R and —COR (where R is a hydrophobic group selected from the group consisting of substituted and unsubstituted aliphatic hydrocarbon groups with 3 to 12 carbon atoms and substituted and unsubstituted alicyclic hydrocarbon groups), and $A_6$ is selected from the group consisting of carboxyl group, hydxoxyalkyl group, hydroxyl group, sulfonic acid group, carboxyalkyl group, mercapto group and phosphono group, the formula:

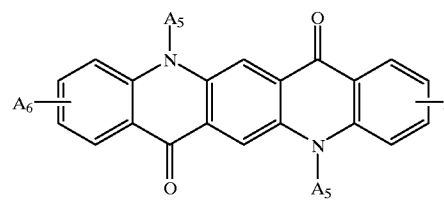

(IV)

wherein the definitions of $A_5$ and $A_6$ are the same as defined above, the formula:

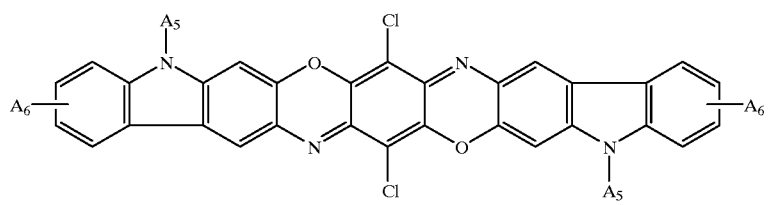

wherein the definitions of $A_5$ and $A_6$ are he same as defined above, the formula:

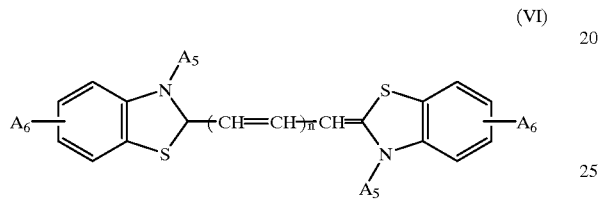

wherein the definitions of $A_5$ and $A_6$ are the same as defined above, the formula:

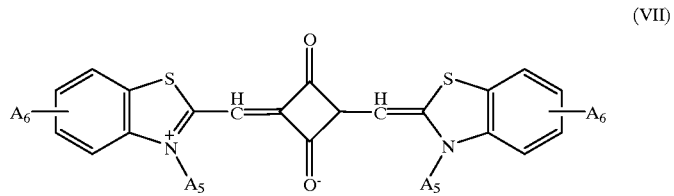

wherein the definitions of $A_5$ and $A_6$ are the same as defined above, the formula:

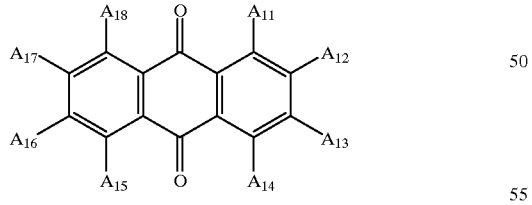

wherein $A_{11}$, $A_{12}$, $A_{13}$, $A_{14}$, $A_{15}$, $A_{16}$, $A_{17}$ and $A_{18}$ are selected from the group consisting of hydrogen, Cl, Br, F, —R, —OR, —NRR', —NCOR (where R and R' are the same or different hydrophobic groups selected from the group consisting of substituted and unsubstituted aliphatic hydrocarbon groups with 3 to 12 carbon atoms and substituted and unsubstituted alicyclic hydrocarbon groups), and interlocking groups selected from the group consisting of carboxyl group, hydroxyalkyl group, hydroxyl group, sulfonic acid group, carboxyalkyl group, mercapto group and phosphono group, at least one of $A_{11}$ to $A_{18}$ is the interlocking group, and at least one of $A_{11}$ to $A_{18}$ is selected from the group consisting of —R, —OR, —NRR' and —NCOR, the formula:

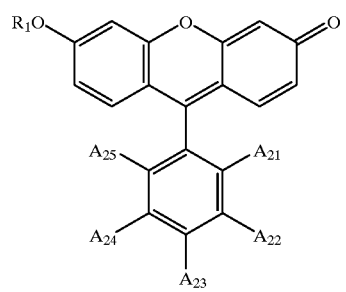

wherein $R_1$ is a hydrophobic group selected from the group consisting of substituted and unsubstituted aliphatic hydrocarbon groups with 3–12 carbon atoms and substituted and unsubstituted alicyclic hydrocarbon groups, $A_{21}$, $A_{22}$, $A_{23}$, $A_{24}$ and $A_{25}$ are selected from the group consisting of hydrogen, Cl, Br, F, carboxyl group, sulfonic acid group, carboxyalkyl group and phosphono group, and at least one of $A_{21}$ to $A_{26}$ is selected from the group consisting of carboxyl group, sulfonic acid group, carboxyalkyl group and phosphono group, and the formula:

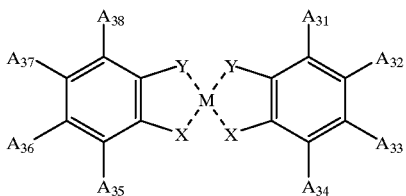

(X)

wherein M is selected from the group consisting of Ni, Pt and Cu, X and Y are selected from the group consisting of $NH_2$, NH, S and Se, and $A_{31}$, $A_{32}$, $A_{33}$, $A_{34}$, $A_{35}$, $A_{36}$, $A_{37}$ and $A_{38}$ are selected from the group consisting of hydrogen, Cl, Br, F, —R, —OR, —NRR', —NCOR (where R and R' are the same or different hydrophobic groups selected from the group consisting of substituted and unsubstituted aliphatic hydrocarbon groups with 3 to 12 carbon atoms and substituted and unsubstituted alicyclic hydrocarbon groups), and interlocking groups selected from the group consisting of carboxyl group, hydroxyalkyl group, hydroxyl group, sulfonic acid group, carboxyalkyl group, mercapto group and phosphono group, at least one of $A_{31}$ to $A_{38}$ is the interlocking group, and at least one of $A_{31}$ to $A_{38}$ is selected from the group consisting of —R, —OR, —NRR' and —NCOR.

6. A method of manufacturing the photoelectric material according to claim 5, comprising the steps of:
dissolving said dye in a hydrophobic and/or aprotic solvent; and
attaching said aye to said semiconductor by bringing said solvent containing said dye into contact with said semiconductor.

7. The photoelectric material according to claim 1, wherein said dye is a metal-free organic compound.

8. A method of manufacturing the photoelectric material according to claim 7, comprising the steps of:
dissolving said dye in a hydrophobic and/or aprotic solvent; and
attaching said dye to said semiconductor by bringing said solvent containing said dye into contact with said semiconductor.

9. The photoelectric material according to claim 1, wherein said hydrophobic group is an alkyl group with 3 to 12 carbon atoms.

10. A method of manufacturing the photoelectric material according to claim 9, comprising the steps of:
dissolving said dye in a hydrophobic and/or aprotic solvent; and
attaching said dye to said semiconductor by bringing said solvent containing said dye into contact with said semiconductor.

11. The photoelectric material according to claim 1, wherein said interlocking group is at least one selected from the group consisting of carboxyl group, hydroxyalkyl group, hydroxyl group, sulfonic acid group, carboxyalkyl group, mercapto group and phosphono group.

12. A method of manufacturing the photoelectric material according to claim 11, comprising the steps of:
dissolving said dye in a hydrophobic and/or protic solvent; and
attaching said dye to said semiconductor by bringing said solvent containing said dye into contact with said semiconductor.

13. The photoelectric material according to claim 1, wherein said semiconductor is in a form of particles or a film.

14. A photoelectric device, comprising,
the photoelectric material according to claim 1, and
an electrode electrically connected to said photoelectric material.

15. A photoelectric device comprising:
a first conductive layer;
the photoelectric material according to claim 1 formed on said first conductive layer;
an electrolyte layer provided on said photoelectric material; and
a second conductive layer in contact with said electrolyte layer.

16. The photoelectric device according to claim 15, wherein said semiconductor is titanium oxide.

17. A method of manufacturing the photoelectric material according to claim 1, comprising the steps of
dissolving said dye in a hydrophobic and/or aprotic solvent; and
attaching said dye to said semiconductor by bringing said solvent containing said dye into contact with said semiconductor.

18. The photoelectric material according to claim 1, wherein said semiconductor is one of a metal oxide semiconductor and cadmium sulfide.

19. A method of manufacturing a photoelectric material, comprising the steps of:
dissolving an organic photosensitising dye in a hydrophobic and/or aprotic solvent; and
attaching said dye to a semiconductor by bringing said solvent containing said dye into contact with said semiconductor.

20. A photoelectric material, comprising:
a semiconductor selected from the group consisting of titanium oxide, zinc oxide, tungsten oxide, barium titanate, strontium titanate, and cadmium sulfide; and
an organic photosensitising dye attached to said semiconductor; wherein
said dye has at least one interlocking group directly bonded to one of the carbon atoms forming a benzene ring, and at least one hydrophobic group selected from the group consisting of monovalent substituted and unsubstituted aliphatic hydrocarbon groups and monovalent substituted and unsubstituted alicyclic hydrocarbon groups,
said interlocking group is at least one selected from the group consisting of carboxyl group, hydroxyalkyl group, hydroxyl group, sulfonic acid group, carboxyalkyl group, mercapto group and phosphono group,
if said dye has a metal, said hydrophobic group does not constitute a group directly bonded to said metal, and
said dye is not any of transition metal complexes comprising a ligand with a pyridyl group, transition metal complexes comprising a ligand with N,N,N',N'-tetra $C_{1-4}$ alkyl ethylene diamine and transition metal complexes comprising a ligand with di-$C_{1-4}$ alkyl glyoxime.

21. A method of manufacturing a photoelectric material, comprising the step of attaching a photosensitising dye represented by at least one selected from the group consisting of

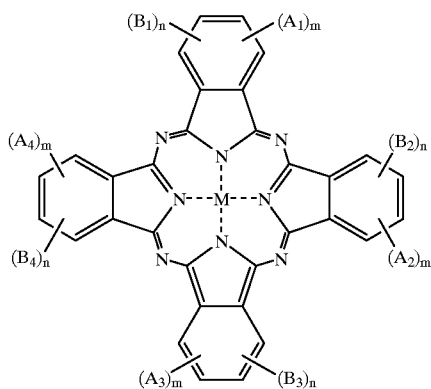

(I)

wherein $A_1$, $A_2$, $A_3$ and $A_4$ are independently selected from the group consisting of hydrogen, carboxyl group, hydroxyalkyl group, hydroxyl group, sulfonic acid group, carboxyakyl group, mercapto group and phosphono group, and at least one of $A_1$, $A_2$, $A_3$ and $A_4$ is not hydrogen; $B_1$, $B_2$, $B_3$ and $B_4$ are selected from the group consisting of —R, —OR, —CH$_2$OR, —SR, —OCOR, —COR, —CONRR' and —NRR' (where R and R' are the same or different hydrophobic groups selected from the group consisting of substituted and unsubstituted aliphatic hydrocarbon groups with 3 to 12 carbon atoms and substituted and unsubstituted alicyclic hydxocarbon groups); n and m independently represent an integer of 0, 1, 2, 3 or 4, where n+m is at most 4; and M represents two hydrogen atoms, or an atom or a compound which may be covalently bonded or coordinately bonded to phthalocyanine, the formula:

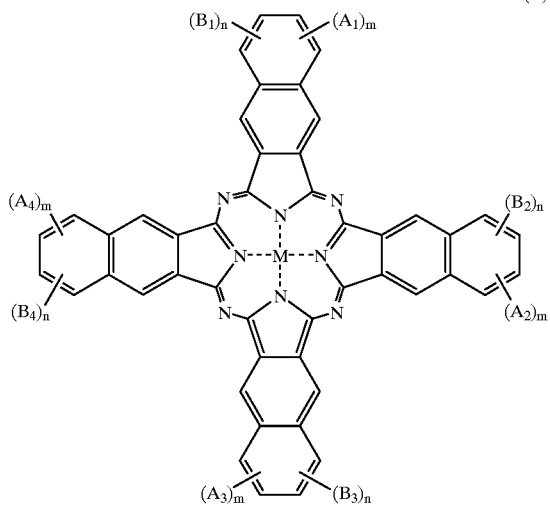

(II)

wherein the definitions of $A_1$, $A_2$, $A_3$, $A_4$, $B_1$, $B_2$, $B_3$, $B_4$, n and m are the same as defined above, the formula:

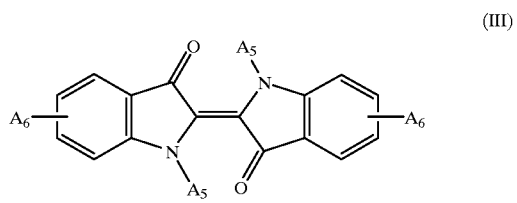

(III)

wherein $A_5$ is selected from the group consisting of —R and —COR (where R is a hydrophobic group selected from the group consisting of substituted and unsubstituted aliphatic hydrocarbon groups with 3 to 12 carbon atoms and substituted and unsubstituted alicyclic hydrocarbon groups), and $A_6$ is selected from the group consisting of carboxyl group, hydroxyalkyl group, hydroxyl group, sulfonic acid group, carboxyalkyl group, mercapto group and phosphono group, the formula:

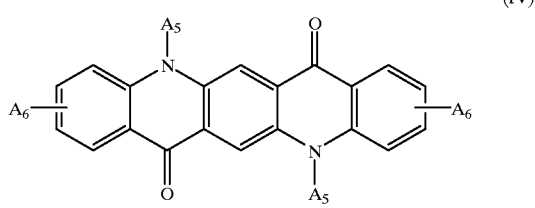

(IV)

wherein the definitions of $A_5$ and $A_6$ are the same as defined above, the formula:

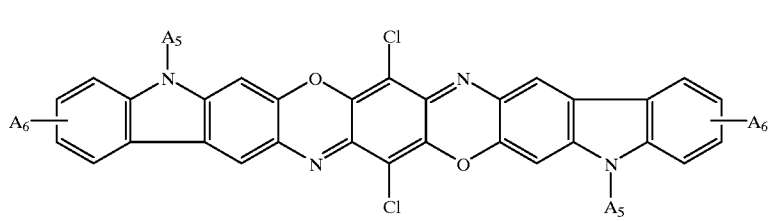

(V)

wherein the definitions of $A_5$ and $A_6$ are the same as defined above, the formula:

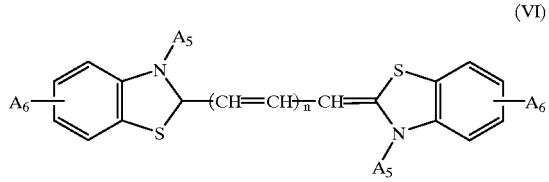

(VI)

wherein the definitions of $A_5$ and $A_6$ are the same as defined above, the formula:

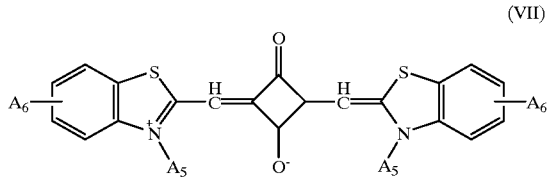

(VII)

wherein the definitions of $A_5$ and $A_6$ are the same as defined above, the formula:

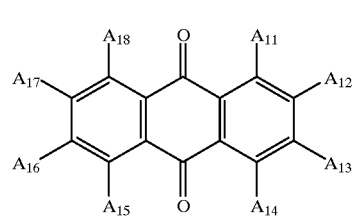

(VIII)

wherein $A_{11}$, $A_{12}$, $A_{13}$, $A_{14}$, $A_{15}$, $A_{16}$, $A_{17}$ and $A_{18}$ are selected from the group consisting of hydrogen, Cl, Br, F, —R, —OR, —NRR', —NCOR (where R and R' are the same or different hydrophobic groups selected from the group consisting of substituted and unsubstituted aliphatic hydrocarbon groups with 3 to 12 carbon atoms and substituted and unsubstituted alicyclic hydrocarbon groups), and interlocking groups selected from the group consisting of carboxyl group, hydroxyalkyl group, hydroxyl group, sulfonic acid group, carboxyalkyl group, mercapto group and phosphono group, at least one of $A_{11}$ to $A_{18}$ is the interlocking group, and at least one of $A_{11}$ to $A_{18}$ is selected from the group consisting of —R, —OR, —NRR' and —NCOR, the formula:

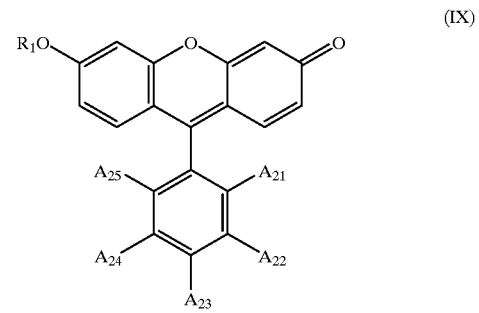

(IX)

wherein $R_1$ is a hydrophobic group selected from the group consisting of substituted and unsubstituted aliphatic hydrocarbon groups with 3–12 carbon atoms and substituted and unsubstituted alicyclic hydrocarbon groups, $A_{21}$, $A_{22}$, $A_{23}$, $A_{24}$ and $A_{25}$ are selected from the group consisting of hydrogen, Cl, Br, F, carboxyl group, sulfonic acid group, carboxyalkyl group and phosphono group, and at least one of $A_{21}$ to $A_{25}$ is selected from the group consisting of carboxyl group, sulfonic acid group, carboxyalkyl group and phosphono group, and the formula:

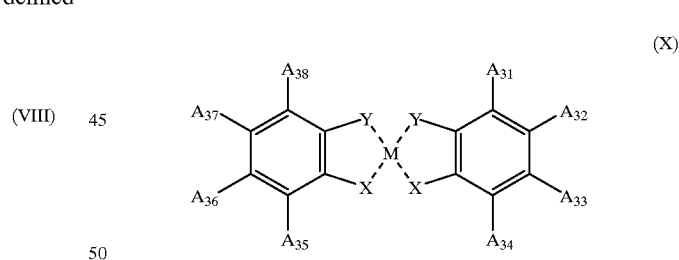

(X)

wherein M is selected from the group consisting of Ni, Pt and Cu, X and Y are selected from the group consisting of $NH_2$, NH, S and Se, and $A_{31}$, $A_{32}$, $A_{33}$, $A_{34}$, $A_{35}$, $A_{36}$, $A_{37}$ and $A_{38}$ are selected from the group consisting of hydrogen, Cl, Br, F, —R, —OR, —NRR', —NCOR (where R and R' are the same or different hydrophobic groups selected from the group consisting of substituted and unsubstituted aliphatic hydrocabon groups with 3 to 12 carbon atoms and substituted and unsubstituted alicyclic hydrocarbon.

22. The method according to claim 21, wherein said step of attaching said photosensitising dye to the semiconductor includes the steps of dissolving said dye in a hydrophobic and/or aprotic solvent, and bringing said solvent containing said dye into contact with said semiconductor.

* * * * *